United States Patent [19]

Gillow

[11] 4,072,869
[45] Feb. 7, 1978

[54] HAZARD-FREE CLOCKED MASTER/SLAVE FLIP-FLOP

[75] Inventor: George B. Gillow, Bonita, Calif.
[73] Assignee: NCR Corporation, Dayton, Ohio
[21] Appl. No.: 749,490
[22] Filed: Dec. 10, 1976
[51] Int. Cl.² ............................................. H03K 3/286
[52] U.S. Cl. .................................... 307/291; 307/208; 307/218; 307/269; 328/206
[58] Field of Search ............... 307/289, 291, 269, 218, 307/208; 328/206

[56] References Cited

U.S. PATENT DOCUMENTS

| | | | |
|---|---|---|---|
| 3,535,544 | 10/1970 | De Troye | 307/291 X |
| 3,575,608 | 4/1971 | Barth | 307/291 X |
| 3,588,546 | 6/1971 | Lagemann | 307/208 X |
| 3,609,569 | 9/1971 | Todd | 307/291 X |
| 3,701,104 | 10/1972 | Wiseman | 307/269 X |
| 3,917,961 | 11/1975 | Reed | 307/269 X |
| 3,993,918 | 11/1976 | Sinclair | 307/291 X |

Primary Examiner—John S. Heyman
Attorney, Agent, or Firm—J. T. Cavender; Edward Dugas; Charles W. Sims

[57] ABSTRACT

The clocked flip-flop circuit of the present invention is one that cannot be caused to yield an erroneous output upon a skew in a clock pulse or, equivalently, the offset of such pulse with respect to its complement. The disclosed flip-flop circuit is comprised of a J-K master portion and a D latch slave portion. Each portion includes a gate having no operative functional definition as respects provision of an output under normal operating conditions of the circuit. In normal operation, the circuit, exclusive of the additional gates, provides HOLD, SET/RESET and TOGGLE functions according as the setting of J and K inputs. Upon skew of a clock pulse, the additionally provided gates insure integrity of the outputs corresponding to the J and K settings by defining a failure mode of operation of the flip-flop, independent of the clock.

10 Claims, 7 Drawing Figures

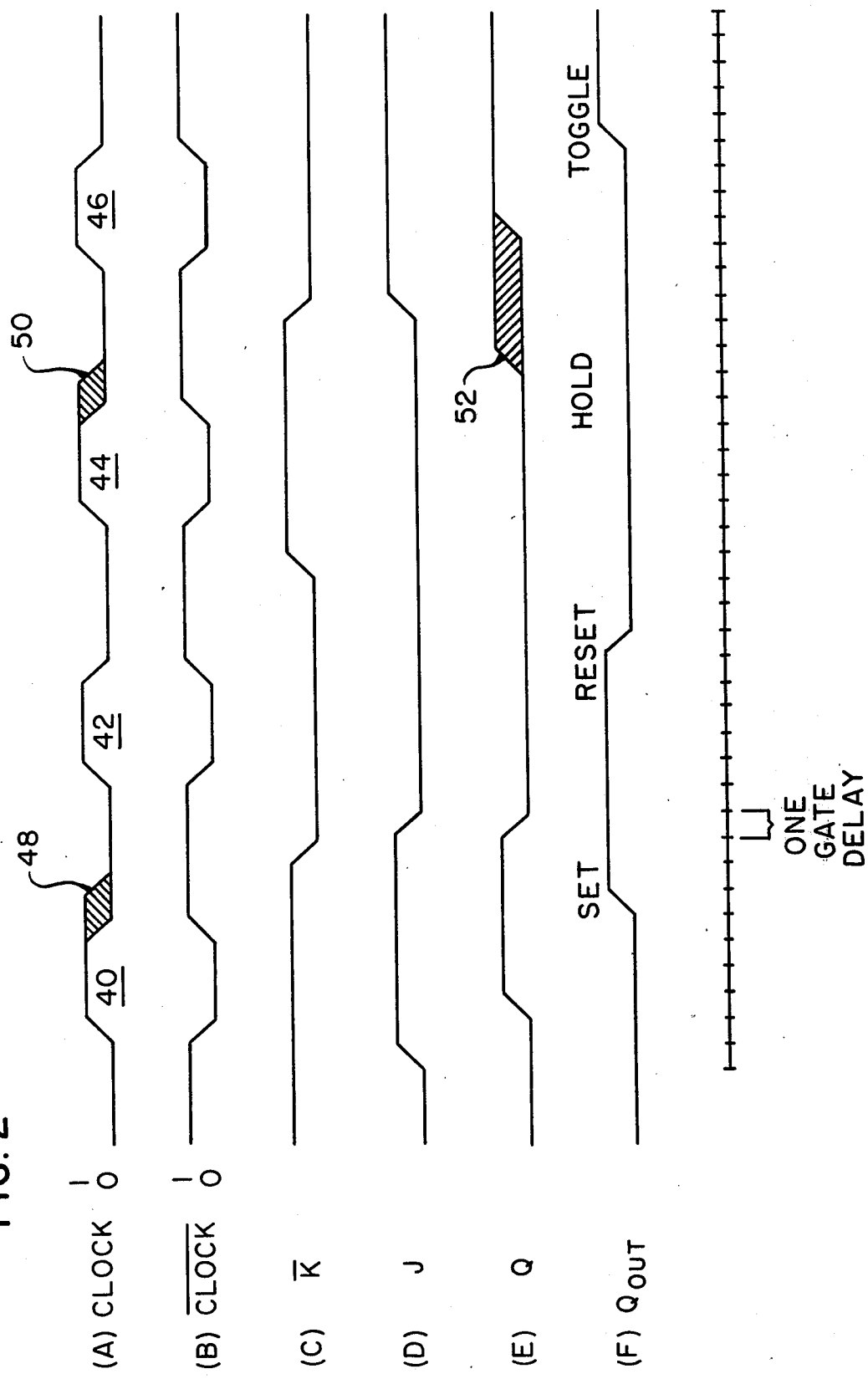

HAZARD-FREE CLOCKED MASTER/SLAVE FLIP-FLOP

BACKGROUND OF THE INVENTION

The present invention relates to flip-flops and, more particularly, to those which operate on principles consonant with the master/slave technique.

The circuit has been designed to achieve fast data thruput while eliminating the timing hazards associated with skew in a clock pulse, which hazards are known to produce inaccurate results in digital counters and the like. The invention is particularly suitable for realization in the form of an integrated circuit. More specifically, the circuit of the present invention is preferably realized in large scale integration of emitter-coupled-logic gate arrays.

Logic design for the structuring of the basic hardware architecture of digital systems has evolved through various stages of sophistication closely correlated with increased efficiency and design in manufacture of the basic media of implementation. Small to medium scale circuit integration techniques have provided adaptable logic on a chip permitting progressively more complex series gating in implementing families of logic functions tailored to specific needs.

In architectures employing small to medium scale integration (SSI/MSI), the measure of flexibility has been viewed as a function of the specific molecular electronic technology selected. For example, emitter-coupled logic implementations (ECL) have been characterized both by facile design of series or stacked gates and by the availability of complementary outputs at each gate or logic level. In contradistinction, transistor-to-transistor implementations (TTL) have tended to be more complex for the reason that the complementary output is not always available. Aside from considerations of flexibility, ECL is inherently faster than TTL while only slightly more expensive.

More recently there has evolved an alternative to SSI/MSI structured architecture. In developing architectures employing the alternative, large scaled integration (LSI), critical design parameters have been speed and flexibility. Although ECL does not lend itself to series gating when employing LSI techniques, the combination of ready availability of complementary outputs and greater speed has tended to indicate its selection over alternatives. However, problems have arisen in attempting to implement ECL SSI/MSI series logic circuits by LSI techniques. These problems derive principally from factors associated with cost and operating environment such as overheating.

A secondary constraint has derived as a material consequence of the migration away from series gating in ECL LSI implementations. Limitations are found in the number of functions or, more precisely, combinations of elements to define functions that may be implemented without introducing timing hazards, i.e., conditions wherein both a clock pulse and its complement may be apparent in a logic circuit at the same time. These conditions may give rise to signal race conditions, i.e., propagation of signals through a system toward plural destinations resulting in spurious data signals reflecting these ambiguous cases. These problems, again, are consequential and exist by virtue of the fast operation, i.e., fast clocking of systems embodying ECL LSI circuits.

The present inventive master/slave flip-flop maintains speed and flexibility of LSI logic circuit implementations while eliminating timing hazards associated with skew of clock pulses, i.e., offset of a clock pulse with respect to its complement in systems embodying such circuits.

SUMMARY OF THE INVENTION

The present invention provides a clocked master/slave flip-flop comprising a master portion having plural similar logic elements for receiving at least data and clock inputs; each logic element providing an output to be associated in a manner dissimilar from the manner of logic association of the inputs; the result comprising the output of the master portion; a slave portion having plural similar logic elements for receiving as inputs the output of the master portion and clock inputs; each element providing an output to be associated in a manner dissimilar from the manner of logic association of the inputs to the slave portion to provide the true output of the flip-flop, and similar to the manner of logic association of the inputs to the slave portion to provide the complementary output of the flip-flop; the true and complementary outputs providing additional inputs to the elements of the master portion; a first redundant logic element operatively associated with the master portion; and a second redundant logic element operatively associated with the slave portion and with the first redundant logic element; the operative association providing both true and complementary outputs upon occurrence of clock skew.

From the foregoing it can be seen that it is a primary object of the present invention to provide an improved master/slave flip-flop.

It is another object of the present invention to eliminate timing hazards associated with skew of a clock pulse, particularly in systems embodying ECL LSI circuits.

It is a further object of the present invention to provide a fast, efficient, cost effective logic circuit of the master/slave flip-flop genus while eliminating problems associated with implementation of such by large scale integration techniques.

These and other objects of the present invention will become more apparent and better understood when taken in conjunction with the following description and drawings, wherein like characters indicate like parts and which drawings form a part of the present application.

DESCRIPTION OF THE PREFERRED EMBODIMENT OF THE INVENTION

Figure 1:
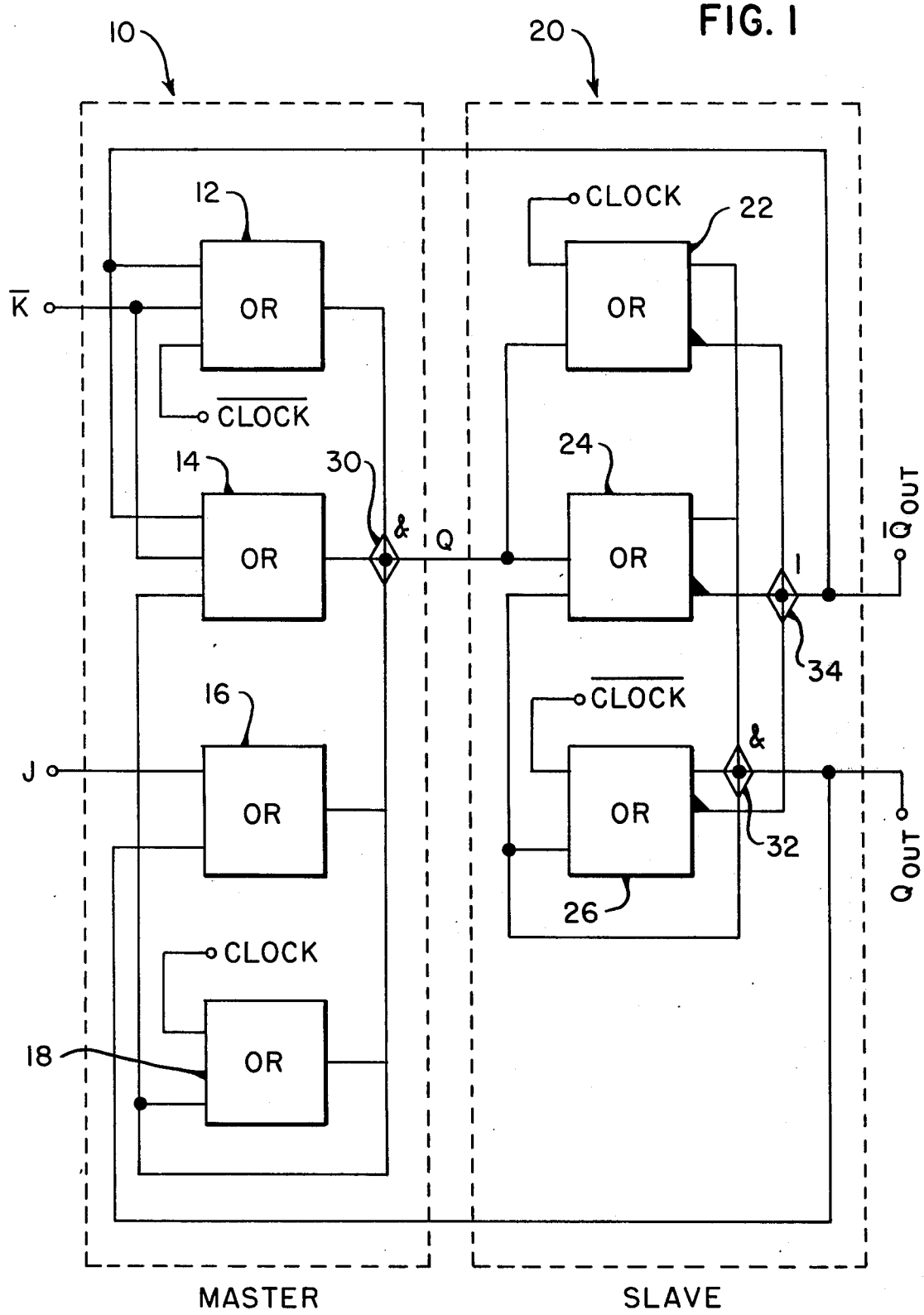
FIG. 1 shows a schematic block diagram of the master/slave flip-flop of the present invention; and, FIGS. 2A through 2F are waveforms showing timing and signal level information of various signals present in the circuit shown in the schematic block diagram in FIG. 1.

Referring now to FIG. 1, there is schematically represented therein a preferred embodiment of a flip-flop constructed in accordance with the present invention which includes a master portion 10 comprising four OR gates 12, 14, 16, 18 and a slave portion 20 comprising three OR gates 22, 24, and 26, each of which additionally may provide complementary outputs (OR/NOR).

The master portion 10 and the slave portion 20 are interconnected to define the Q output of the master portion as an input to the slave portion; more specifically, at an input to gates 22 and 24 thereof, and both the $Q_{out}$ and $\overline{Q}_{out}$ (true and complementary outputs) of the slave portion as feedback latching inputs to the master portion; more specifically, at an input to gate 16 in the first instance and gates 12 and 14 in the second. The Q output of the master portion 10 provides an additional feedback latching input to the master portion, more specifically at an input to gates 14 and 18. The $Q_{out}$ of the slave portion 20 provides an additional feedback latching input to the slave portion at an input to gates 24 and 26 thereof. Gates 12 and 16 provide inputs for the data signals to be operated upon, viz., $\overline{K}$ and J respectively. Master portion inputs for CLOCK/$\overline{\text{CLOCK}}$ signals are provided at gates 12 and 18; while slave portion inputs for these timing and control signals are provided at gates 22 and 26. Gate 14 additionally provides an input for the data signal $\overline{K}$.

Each of the gates of the master portion 10 and the slave portion 20 is provided with a transistor (not shown) having an open collector. The provision of the open collector permits logic association of the respective outputs of the gates 12, 14, 16 and 18 of the master portion 10 by a technique referred to as "collector dotting". To be noted, with a focus on that referenced by reference numeral 30, is the combination of the diamond and ampersand intended to denote a "wire-AND" function achieved by collector dotting an open collector of a respective transistor of each of the gates 12, 14, 16 and 18. In a similar manner, the true outputs of the gates 22, 24 and 26 of the slave portion 20 are AND'ed as shown at 32 to provide the true output, $Q_{out}$, of the flip-flop, while the complementary outputs are "wire-OR'ed" as indicated by the diamond in combination with a "1" and referenced by the reference numeral 34.

Functionally, in the preferred embodiment, the master portion 10 is a J-K flip-flop or master latch, i.e., one the clocking of which provides a 1 output when the J input is 1 and the K input is 0, a 0 when the J input is 0 and the K input is 1, and the opposite of its instant setting when both are 1, and, the slave portion 20 is a D latch, or, equivalently, one whose output is a function of the input that appeared one clock pulse earlier. The master/slave interdependence is seen by examining the input signals to the master portion 10 and the slave portion 20, their various combinations and, more particularly, the feedback of both the output of the master portion and the true and complementary outputs of the flip-flop to define inputs to the master portion at gates 14 and 18 in the first instance, gate 16 in the second and gates 12 and 14 in the third.

The principles of the present invention in their broader aspects will be appreciated most readily in connection with a discussion thereof with the flip-flop configured to function as shown. Those principles will be demonstrated with reference to the Boolean expressions relating the functional interrelationships of the various inputs and outputs expressed as explicit functions of time. The maxterm logic equations are written in the order of reference numeral sequences 12 through 18 corresponding to the OR gates of the master portion 10, and 22 through 26 corresponding to the OR gates of the slave portion 20.

$$Q_{t+1} = (\overline{Q_{out_t}} + \overline{K} + \overline{\text{CLOCK}}) \cdot (\overline{Q_{out_t}} + \overline{K} + Q_t) \cdot (J + Q_{out_t}) \cdot (\text{CLOCK} + Q_t) \quad (1)$$

$$Q_{out_{t+1}} = (\text{CLOCK} + Q_t) \cdot (Q_t + \overline{Q_{out_t}}) \cdot (\overline{\text{CLOCK}} + Q_{out_t}) \quad (2)$$

Where:

$Q_{t+1}$ and $Q_{out_{t+1}}$ are the Q and $Q_{out}$ functions after clock transition and:

$Q_t$ and $Q_{out_t}$ are the Q and $Q_{out}$ functions before a clock transition.

By way of clarification and to define unambiguously the notation selected to express these functions, it will be noted that the flip-flop of FIG. 1 is one that is triggered on the falling edge of a clock pulse as opposed to one that is triggered on the rising edge of a clock pulse. In order that the opposite be true it would be simply a matter of reversing the CLOCK and $\overline{\text{CLOCK}}$ inputs at each of the gate inputs shown, notably the inputs to gates 12, 18, 22 and 26.

By way of further clarification, all signals shown are readily available in a digital system of which the flip-flop of FIG. 1 forms a part. Thus, $\overline{K}$, which is required in the instant implementation would be derived as a complementary output of another circuit in the system. Characteristically, numerous identical circuits would be grouped for more complex structure such as a shift register or counter.

From an examination of expression (1), it is seen that there exists a maxterm for which there exists no requirement in order that the traditional functions associated with a J-K flip-flop be performed. Such is the expression: ($\overline{Q_{out_t}} + \overline{K} + Q_t$) which corresponds to the term of the Boolean expression contributed by gate 14. Thus, gate 14 is a redundant gate, the purpose of which will be made apparent hereinafter in connection with a discussion of FIGS. 2A through 2F.

From an examination of expression (2), it is seen that there exists a maxterm for which there exists no requirement in order that the traditional function associated with a latch be performed. Such is the expression: ($Q_t + \overline{Q_{out_t}}$) which corresponds to the term of the Boolean expression contributed by gate 24. Thus, gate 24 is a redundant gate, the purpose of which will be made apparent hereinafter in connection with the discussion of FIGS. 2A through 2F.

There will be described the combination of a J-K function and a D function implemented by the master/slave technique which may be realized by interconnecting the outputs from logic elements such as gates 12, 16 and 18 such that an AND function is distributed over the maxterms represented thereby, similar activity as respects logic elements such as gates 20, 22, and 26, and the interconnection of a master portion such as that indicated generally by the reference numeral 10 and a slave portion such as that indicated generally by the reference numeral 20. It will be apparent to one skilled in the art that the instant discussion is included herein merely for purposes of providing a background for a discussion of the technical problems encountered in certain systems incorporating such master/slave flip-flops, notably those wherein requirements for speed of propagation of data pulses may introduce timing hazards associated with system clock skew. This clock skew is associated with transition of CLOCK/$\overline{\text{CLOCK}}$ pulses in at least those systems wherein timing of operation of logic elements may be in the 0.5 to 5 nanosecond range.

Briefly, clocked J-K master latch, i.e., SET/RESET, HOLD, and TOGGLE functions are realized by the AND of the maxterms previously associated with gates 12, 16 and 18. Gate 12 is the K input gate, gate 16 is the J input gate and gate 18 performs the saving function which may define a J-K flip-flop as a latch. The latching function is referenced by the term "HOLD".

Essentially, gate 18 saves the state of the master latch 10, i.e., Q, in the absence of a clock pulse, as will be apparent from inspection of the maxterm for such gate, i.e., $(\overline{CLOCK} + Q)$. Both gates 22 and 26 are necessary to do the latch function in the slave portion 20. The slave portion 20, standing alone, may be viewed as an ordinary D latch. In this instance, the Q output of the master latch 10 provides at gate 22 the D or data input normally associated with such latches, while the state saving gate is, in this instance, gate 26, which saves the most recent input data signal.

The basic functions of the J-K flip-flop 10 will now be discussed with reference to the timing diagrams of FIGS. 2A through 2F, a continued reference to the circuit of FIG. 1, and a consideration of the Boolean expressions (1) and (2) in connection with the operation thereof responsive to CLOCK/$\overline{CLOCK}$ input signals. Again, a brief exposition will be presented, and, merely for purposes of demonstration of the normal function thereof, in an operating environment wherein system clock skew poses no problem. First, there is to consider that "J function" is synonymous with "SET function", "K function" is synonymous with "RESET function" and that "J-K TOGGLE function", as the term suggests, requires that certain specified input conditions exist at both the J input to gate 16 and the K input to gate 12. Thus, one will perceive readily the correlation with clocked S-R latches, should that be the point of reference in approaching the teaching of the instant invention. In accordance with a broad aspect of the invention, S-R latches might be employed in the master portion 10 and the slave portion 20.

The term of expression (1) which is necessary to do the J function is $(J+\overline{Q_{out_t}})$. That necessary to do the K function is $(\overline{Q_{out_t}}+\overline{K}+\overline{CLOCK})$. TOGGLE is accomplished when both J and K are logic 1 so that both maxterms are required in order that that function be performed. $(\overline{CLOCK}+Q_t)$, as previously stated, serves as the latch for the J-K portion 10, so that, as shown in FIGS. 2A through 2F, the inclusion of this maxterm is necessary to hold the condition of the flip-flop in either a 1 or 0 logic state in the absence of a clock pulse. All three maxterms are required consistently to do the TOGGLE function as will become apparent hereinafter in connection with a more detailed discussion of FIGS. 2A through 2F. An understanding of the latch, or, state saving function of the master J-K flip-flop and the slave D latch, will derive as a natural consequence of a focus on the HOLD, SET/RESET and TOGGLE functions.

In FIGS. 2A through 2F, it will be noted that the synchronized CLOCK/$\overline{CLOCK}$ pulses are numbered consecutively from left to right as indicated by the reference numerals 40, 42, 44 and 46 to designate both first, second, third and fourth CLOCK and $\overline{CLOCK}$ pulses. Skewed CLOCK conditions for the first and third CLOCK pulses 40 and 44 respectively, are indicated by the reference numerals 48 and 50. At 52 there is demonstrated a consequence of the skewed clock pulse 50; while the consequence of skewed pulse 48 is somewhat difficult to demonstrate pictorially, therebeing a continued effect over a relatively long time period. The consequence will be described hereinafter.

There will first be described the creation of a SET output condition of the flip-flop of FIG. 1. As shown in the timing diagrams 2C and 2D, $\overline{K}$ is high at logic 1 before the arrival of CLOCK pulse 40, and J, initially at logic 0, is brought high during the presence of the CLOCK pulse. In that J at logic level 1 and $\overline{K}$ at logic level 0 (K=1) are the conditions permitting a J-K flip-flop to assume the SET condition, this will occur during the presence of the CLOCK pulse, more precisely one gate delay after the changing of CLOCK to a logic 1, as best appreciated with reference to FIGS. 2A, 2E and the reference scale whereat "one gate delay" is shown. This may also be seen with reference to Boolean expression (1). In the event that Q output of the J-K master portion 10 had previously been at the 1 level, it would have remained at that level upon inputting of a CLOCK pulse.

$Q_{out}$ for the master/slave flip-flop is unaffected as seen with reference to the waveform of FIG. 2F. $Q_{out}$ remains unaffected until CLOCK drops again to the logic 0 level, or, more precisely, one gate delay or time increment after falling clock. Thus, for the master/slave flip-flop FIG. 1, the characterization as a falling edge triggered flip-flop of one gate delay, is demonstrated for the SET condition. In terms of reflection of Q input to the slave latch 20 to $Q_{out}$ output thereof, Q input becomes $Q_{out}$ one gate delay after a falling CLOCK transition. As respects latching, it is seen with reference to the waveform of FIG. 2F, the $Q_{out}$ will remain at the SET condition, i.e., logic 1, until a second pair of J and K input conditions exists and a second clocked output is called for thereby.

The creation of the RESET output condition will now be demonstrated with reference to the waveforms of FIGS. 2C and 2D as respects data inputs, 2A as respects CLOCK pulse inputs, 2E as respects Q slave input and F as respects $Q_{out}$ of the flip-flop. The J input becomes a logic 0, and $\overline{K}$ becomes a logic 0 (K=1). The Q output of the J-K master latch goes to logic 0 coincident with J, i.e., Q is independent of the CLOCK for this condition. Upon arrival of CLOCK, i.e., CLOCK pulse 42, it is seen that Q is not reflected as $Q_{out}$ of the slave portion 20. A Q input of logic 0 maintains $Q_{out}$ at its present output logic state until a negative going or falling CLOCK transition, which transition does occasion a change in output logic state as demonstrated with reference to the waveforms of FIGS. 2A and 2F, notably the accomplishment of the RESET function one gate delay after negative CLOCK transition shown at 42.

The HOLD function will now be demonstrated with reference to the waveforms of FIGS. 2C and 2D as respects data inputs, 2A as respects CLOCK pulse inputs, 2E as respects Q slave input and 2F as respects $Q_{out}$ of the flip-flop. With J input at the zero logic level, $\overline{K}$ at 1 (K=0) and Q slave input at the zero logic level, the arrival of CLOCK, i.e., CLOCK pulse 44, Q slave input remains at the zero logic level. Thus, under these conditions, there is no change in the output of the flip-flop. Hence, the output is held at the $Q_{out}$ existing prior to the arrival of the CLOCK pulse 44.

There will now be demonstrated with reference to the waveforms and corresponding inputs set forth in discussing previous conditions, the TOGGLE function of the flip-flop of FIG. 1. The conditions adequate to a demonstration of this function are J at the logic level 1, $\overline{K}$ at logic level 0 (K=1), and $Q_{out}$ reflecting the output of the flip-flop from the previous conditions fed back to master latch input gates 12 and 14, which output is at the 0 logic level. Upon arrival of CLOCK, i.e., CLOCK pulse 46, Q slave input goes high, to logic level 1. Now there exists a complete set of conditions for a change in logic level of $Q_{out}$, in this instance, from a logic 0 to a logic 1. This occurs one gate delay after the negative going transition of CLOCK pulse 46. In order to appreciate the function of the master/slave J-K flip-flop in toggling from logic 0 to logic 1, one need only reverse the various inputs and prior $Q_{out}$ feedback shown in the drawing, FIG. 1. In many applications it may be desirable to permanently set $\overline{K}$ to a logic 0 (K=1), J equal to a logic 1 and derive the opposite $Q_{out}$ from that previously available upon the passage of each CLOCK pulse.

There will now be demonstrated with reference to all that to which reference has been made in preceding discussions and, additionally, gates 14 and 24 of FIG. 1, the solution to problems arising from hazard conditions associated with CLOCK/$\overline{CLOCK}$ skew, which solutions are derivative from J-K flip-flop implementations in accordance with the specific master/slave technique of the present invention. First consider the CLOCK to be at the high or logic 1 level upon the arrival of $\overline{CLOCK}$, i.e., the transition of $\overline{CLOCK}$ to the logic 1 level, a condition indicated by the reference numeral 48. For the sake of simplicity, CLOCK skew will be shown as being equal to one gate delay. The skew 48 is illustrative of the case where skewed CLOCK would cause difficulty in the sense of causing a change of the logic output, $Q_{out}$, to a state distinct from that which normally would be assumed, given the inputs previously discussed in connection with setup for the SET function of the flip-flop. This is readily seen by noting that $\overline{K}$ would have made its transition from a logic 1 to a logic 0 state prior to the time interval during which the SET condition would occur, notably, one gate delay after falling CLOCK transition. Thus, the SET condition, and subsequent conditions, would never be assumed.

With reference to the Boolean expression (1), it is seen that provision of the redundant gate 14 will permit the set condition to occur. This is readily appreciated when one considers that the maxterm is satisfied by $\overline{Q_{out}}$ at logic 1 ($Q_{out}=0$) or $Q_t$ at logic 1. One or the other will always be the case upon therehaving been a negative going clock transition. This may be appreciated most readily by considering that at that time $Q_t$ output of the master portion 10, as determined by the definition of "J-K" flip-flop appearing hereinabove, becomes $Q_{out}$ for the slave portion 20 (or, equivalently, the master/slave flip-flop as a whole). Thus the conditions imposed by the maxterm corresponding to gate 14 are satisfied by a logic statement as simple as: "A logic variable that must always be either 1 or 0, is either 1 or 0". (One gate delay after falling clock transition, they are the same logic variable.) Thus, $\overline{K}$ at logic level 0 will not prevent the proper functioning of the flip-flop of FIG. 1, under the conditions depicted, by virtue of the provision of redundant gate 14.

There will now be demonstrated, with reference to Boolean expressions (1) and (2), a second solution to a timing hazard, notably, that demonstrated by a second skew of CLOCK relative to $\overline{CLOCK}$ indicated by the reference numeral 50. Shown at 52 is the consequence of the skewed pulse 50, absent the redundant gate 14. In certain cases Q output of the master portion 10 having been forced high to logic 1, may occasion forcing $Q_{out}$ of the slave portion 20 to a logic 1. The input conditions previously discussed in connection with a demonstration of circuit operation in the HOLD output condition are illustrative of one instance wherein this would occur. A review of that discussion will bring to mind that the desired result was the retention of a previous latched output upon occurrence of a falling CLOCK transition. As shown, at 52, and, again, with reference to Boolean expression (2), this condition cannot be maintained if the Q output of master portion 10 has risen to a logic level of 1. This may be appreciated by noting that the conditions imposed by the maxterm definitions for both gates 22 and 26 are satisfied simultaneously upon a skewed clock condition, or, equivalently, when both CLOCK and $\overline{CLOCK}$ are at logic level 1 simultaneously.

The solution to the problem of the paragraph next preceding is seen by a consideration of the functions of both gates 14 and 24. As discussed previously, gate 14 functions to prevent the change in state of the master portion 10 to the outputting of a logic 1 shown at 52 responsive to the skew of CLOCK shown at 50. Given that Q output of the master portion 10 has remained at the 0 logic level, the conditions imposed by the maxterm corresponding to gate 24 are not met, viz., that one or the other of $Q_t$ or $Q_{out_t}$ must be at logic level 1. Thus, the output of the flip-flop remains at logic level 0 or, equivalently, the integrity of the output for the HOLD function is insured.

No change has been made to the waveform of FIG. 2F to emphasize that single skewed CLOCK pulse may give rise to propagation of error so that many erroneous outputs of the master/slave flip-flop of FIG. 1 would obtain. Once a single skew had occurred it could be the case that no predictable result could be obtained at the output of the flip-flop of FIG. 1. For example, one might consider the case where immediately after CLOCK skew, conditions were set up for the TOGGLE function to be performed indefinitely. The opposite $Q_{out}$ logic level output would be available from that anticipated, again, indefinitely. More specifically, with renewed emphasis on that shown in FIGS. 2A through 2F, the consequence of CLOCK pulse skew 50 is master latch output Q prematurely rising to the logic level 1, as shown at 52, thereby immediately causing the TOGGLE, again, prematurely. By logical extension of that discussed previously in connection with the TOGGLE function, the output of the circuit would be incorrect indefinitely, or until a second CLOCK skew. Thus, it is seen that the immediate error in failure to maintain the HOLD function, causing the waveform of FIG. 2F to go to high logic level before the arrival of CLOCK pulse 46, would cause both a TOGGLE from logic level 1 to logic level 0, the opposite of that desired, and indefinite error for as long as the data inputs J and K were set for TOGGLE.

The function of the J-K flip-flop circuit of FIG. 1 has been described with sufficient particularity to lend an understanding of the principles of the invention in their broader aspects. It will be apparent that many combinations and permutations of similarly arranged and functionally equivalent arrangements of elements are possible. The logic association of the various inputs to the logic elements of the master portion need only be defined as similar while the outputs are combined in the opposite manner, or, equivalently, in a manner dissimilar from the association of the inputs. The same statement applies to the slave portion insofar as determining its true output. Its complementary output derives from logic association opposite to that determining the true output. For example, as alternative arrangement of logic elements useful in implementing a J-K flip-flop consonant with the master/slave technique in accordance with a broad aspect of the present invention is one wherein AND gates are substituted for OR gates, "wire-AND's" and "wire-OR's" reversed, and the inputs arranged accordingly, viz. J, CLOCK, $\overline{K}$ and $\overline{CLOCK}$, from top to bottom in FIG. 1, assuming that FIG. 1 had been altered in accordance with the alternative suggested embodiment. As will be apparent, negative logic (1 = low level and 0 = high level) would be required for this implementation.

In each alternative embodiment, there are provided the redundant gates to insure hazard-free flip-flop operation. The redundant gates, in each instance define maxterms imposing conditions which are satisfied irrespective of the simultaneous presence of a clock pulse and its complement. Equivalently, the redundant gates define maxterms in the Boolean equations for both the master portion and the slave portion having neither a CLOCK nor a CLOCK complement input defined. Thus, integrity of the output is insured upon a skew in a CLOCK pulse.

Thus, it is seen that it is not intended that the invention should be limited to the specific embodiments described but only in accordance with the spirit and scope of the appended claims.

What is claimed is:

1. A clocked master/slave flip-flop comprising:
   a. a master portion for receiving at least data and clock inputs, said master portion comprising plural similar logic elements, each element providing an output to be associated in a manner dissimilar from the manner of logic association of said inputs, the result comprising the output of said master portion responsive to synchronized clock pulses;
   b. a slave portion comprising plural similar logic elements, certain ones for receiving as inputs the output of said master portion and said clock inputs, each element providing an output to be associated in a manner dissimilar from the manner of logic association of said inputs to said slave portion to provide the true output of the flip-flop, and similar to the manner of logic association of said inputs to said slave portion to provide the true and complementary outputs of the flip-flop responsive to synchronized clock pulses, said true and complementary outputs providing additional inputs to certain ones of said elements of said master portion, said true output providing additional inputs to certain ones of said elements of said slave portion;
   c. a first redundant logic element defining an additional similar logic element of said master portion, receiving as inputs thereto a data input, an output of said master portion and an output of the flip-flop, and providing an output to be associated in a manner dissimilar from the manner of logic association of said inputs to said first redundant logic element, the result comprising the output of said master portion upon occurrence of a clock skew; and,
   d. a second redundant logic element defining an additional similar logic element of said slave portion, interconnected with said master portion to receive the output thereof, with an output of the flip-flop to receive at an input thereto the output thereof, and providing an output to be associated in a manner dissimilar from the manner of logic association of said inputs to said second redundant logic element, the result comprising an output of the flip-flop upon occurrence of a clock skew.

2. The clocked master/slave flip-flop according to claim 1 adapted for operation responsive to positive logic inputs defined as logic one high and logic zero low.

3. The clocked master/slave flip-flop according to claim 1 adapted for operation responsive to negative logic defined as logic one low and logic zero high.

4. The clocked master/slave flip-flop according to claim 1 wherein said master portion is comprised of four gates, and said slave portion is comprised of three gates, said master and slave portions defining a J-K master latch and slave D latch respectively.

5. The clocked master/slave flip-flop according to claim 1 adapted to provide an output from said master portion upon occurrence of a given clock pulse and from said slave portion upon occurrence of the next clock pulse.

6. The clocked master/slave flip-flop according to claim 4 adapted to provide an output from said master portion upon occurrence of a given clock pulse and from said slave portion upon occurrence of the next clock pulse.

7. A clocked master/slave J-K flip-flop comprising:
   a. a master J-K latch portion for receiving at least J and K data inputs and providing a first output determined as a function of said inputs, responsive to inputting of a first synchronized clock pulse;
   b. a slave D latch portion for receiving at least said first output and providing true and complementary outputs of the flip-flop responsive to inputting of a second synchronized clock pulse;
   c. a first gate defining a redundant logic element of said master portion, interconnected therewith and with said slave portion, receiving as inputs thereto a data input, an output of said master portion and an output of the flip-flop, operative upon occurrence of a clock skew to provide an output of said master portion; and,
   d. a second gate defining a redundant logic element of said slave portion, interconnected with said master portion to receive an output thereof, with an output of the flip-flop to receive at an input thereto an output thereof, and operative upon occurrence of a clock skew to provide at least one additional output of the flip-flop.

8. The clocked master/slave J-K flip-flop according to claim 7 wherein said master portion is comprised of four similar gates and said slave portion is comprised of three similar gates.

9. The clocked master/slave flip-flop according to claim 7 adapted to provide an output from said master portion upon occurrence of a given clock pulse and from said slave portion upon occurrence of the next clock pulse.

10. The clocked master/slave flip-flop according to claim 8 adapted to provide an output from said master portion upon occurrence of a given clock pulse and from said slave portion upon occurrence of the next clock pulse.

* * * * *